United States Patent [19]

Solomon

[11] Patent Number: 4,962,409
[45] Date of Patent: Oct. 9, 1990

[54] STAGGERED BANDGAP GATE FIELD EFFECT TRANSISTOR

[75] Inventor: Paul M. Solomon, Yorktown Heights, N.Y.

[73] Assignee: International Business Machines Corporation, Armonk, N.Y.

[21] Appl. No.: 483,289

[22] Filed: Feb. 16, 1990

Related U.S. Application Data

[63] Continuation of Ser. No. 198,727, May 24, 1988, abandoned, which is a continuation of Ser. No. 5,069, Jan. 20, 1987, abandoned.

[51] Int. Cl.$^5$ .................. H01L 29/161; H01L 29/80
[52] U.S. Cl. .......................... 357/22; 357/16
[58] Field of Search ...................... 357/22, 16

[56] References Cited

U.S. PATENT DOCUMENTS

| 4,163,237 | 7/1979 | Dingle et al. | 357/22 |
| 4,625,225 | 11/1986 | Goodfellow et al. | 357/22 |

FOREIGN PATENT DOCUMENTS

| 114962 | 8/1984 | European Pat. Off. | 357/22 |
| 184827 | 6/1986 | European Pat. Off. | 357/22 |
| 0200933 | 7/1986 | European Pat. Off. | |
| 58-147169 | 9/1983 | Japan | 357/22 |
| 59-5675 | 1/1984 | Japan | 357/22 |
| 59-100576 | 6/1984 | Japan | 357/22 |
| 59-149063 | 8/1984 | Japan | 357/22 |

OTHER PUBLICATIONS

R. Leheny et al., "An $IN_{0.53}Ga_{0.47}AS$ JFET", IEEE Elec. Dev. Lett., vol. EDL-1, #6, Jun. 1980, pp. 110–111.

"GaAs FET With a Degenerate Semiconductor Gate", Y. Umemoto et al., IEDM's Technical Digest, Washington, D.C., Dec. 1–4, 1985, pp. 86–89.

Primary Examiner—Rolf Hille
Assistant Examiner—Wael Fahmy
Attorney, Agent, or Firm—Thomas J. Kilgannon, Jr.

[57] ABSTRACT

A field effect transistor having a highly doped gate wherein both the gate and the channel are different semiconductors with an energy band relationship that provides a barrier to both electrons and holes. The energy band relationship is staggered so that tunneling of electrons from the channel into the gate and holes from the gate into the channel is suppressed. An example structure is an InP light p conductivity type channel with a heavily doped AlInAs p++ conductivity type gate.

5 Claims, 2 Drawing Sheets

STAGGERED BANDGAP GATE FIELD EFFECT TRANSISTOR

This application is a continuation of application Ser. No. 07/198,727, filed May 24, 1988, now abandoned, which is a continuation of application Ser. No. 07/005,069, filed Jan. 20, 1987, now abandoned.

TECHNICAL FIELD

The technical field of the invention is in field effect transistors wherein a signal on a gate electrode modulates carrier flow in a channel region from a source to a drain electrode. In such devices, mobility and control advantages have been achieved when the field effect transistor is fabricated in all semiconductor material.

BACKGROUND ART

Advantages have been achieved in Field Effect Transistors using the physical properties of compound semiconductors. The use of a heterojunction between two compound semiconductors in the channel of a FET employed to enhance carrier mobility in that channel is shown in U.S. Pat. No. 4,538,165, and the use of a higher bandgap semiconductor as the gate in an FET is shown in U.S. Pat. No. 4,379,005.

DISCLOSURE OF THE INVENTION

The invention is a field effect transistor with a gate region selected with a semiconductor having the valence and conduction bands thereof staggered with respect to the valence and conduction bands of the semiconductor chosen for the channel of the field effect transistor.

In accordance with the invention, the heterojunction formed by the staggered bandgap semiconductors exhibit adjacent accumulations of electrons and holes on the two sides of the gate to channel interface. Transconductance in the channel region is enhanced by the fact that there is minimum separation between the gate and the channel region.

Figure 1:
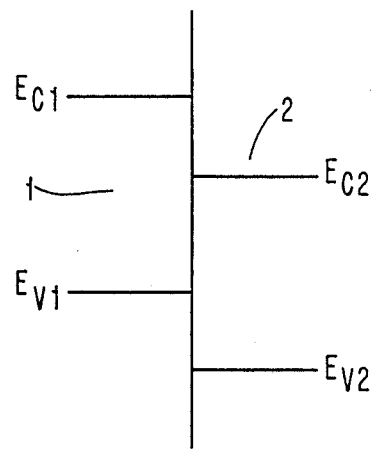
FIG. 1 is an illustration of a staggered bandgap condition at an interface between two semiconductors.

Referring to FIG. 1, a generalized energy band diagram of the semiconductors at the interface between the gate and the channel of the field effect transistor of the invention is shown. In FIG. 1, the semiconductor 1 which serves as the gate has the valence band thereof labelled $E_{V1}$ and the conduction band thereof labelled $E_{C1}$. Semiconductor 2 where the channel will be located has the valence band thereof labelled $E_{V2}$ and the conduction band thereof labelled $E_{C2}$. The bands are offset or staggered at the interface between the two semiconductors.

Figure 2:
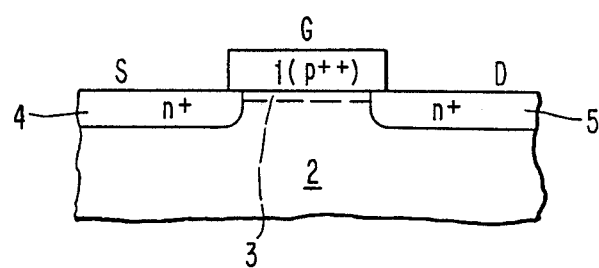
FIG. 2 is an illustration of the field effect transistor of the invention having a gate of a semiconductor material having a staggered bandgap with respect to the semiconductor of the channel.

Referring next to FIG. 2, there is an illustration of the field effect transistor. In FIG. 2, a gate 1 of semiconductor material forms a heterojunction interface with a channel semiconductor 2 providing an inversion region 3 between source 4 and drain 5 heavily doped regions. The arbitrary designations of n and p conductivity type are employed.

Figure 3:
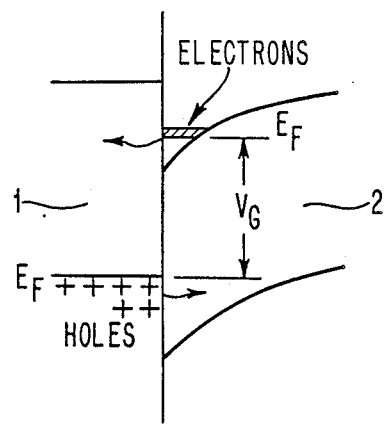
FIG. 3 is an illustration of the band conditions in the "on" condition for the transistor of FIG. 2.

Referring next to FIG. 3, where band bending of the valence band of semiconductor 1 is considered minimal, in accordance with the invention, the gate 1 is very heavily doped, shown as p++ and hence is highly conductive, and has little band bending so that most of the gate signal is applied to control of conduction in the channel. Under these conditions, the carriers, electrons in n conductivity type material in the inversion portion 3 of the channel semiconductor 2 are energetically opposite the forbidden gap of the gate semiconductor 1 and correspondingly the carriers, holes in p conductivity type material, in the gate semiconductor 1 are opposite the forbidden gap of the channel semiconductor 2. These conditions in a field effect transistor suppress tunneling of carriers between the gate and the channel, permit the gate to be immediately adjacent the channel and improves transconductance without the penalty of gate leakage. The threshold voltage of the field effect transistor is determined only by the work function difference between the two semiconductors and hence is very reproducible.

In FIG. 3, the inversion layer 3 of FIG. 2 is formed under forward gate bias applied with a positive voltage between the gate 1 and the channel semiconductor 2.

Further in connection with FIG. 3, the electrons in the channel are energetically opposite the forbidden gap of the semiconductor 1 chosen to be the gate. Similarly, the holes in the semiconductor chosen to be the gate are opposite the forbidden gap of the semiconductor 2 chosen to be the channel. Thus, tunneling of electrons into the gate 1 from the channel 2 and holes into the channel 2 from the gate 1 is suppressed. This permits the highly conductive p++ gate 1 to be thus immediately adjacent the channel 2 and inversion region 3 with no intervening insulator thereby providing, in accordance with the invention, a field effect transistor having maximum transconductance.

Gate current will result from recombination of electrons and holes but the current is much smaller than that of the channel current.

Figure 4:
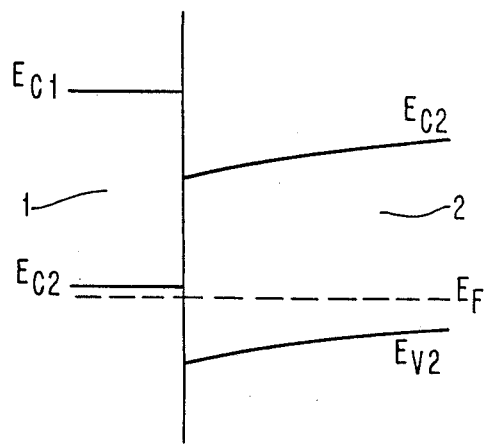
FIG. 4 is an illustration of the band conditions in the "off" condition for the transistor of FIG. 2.

The field effect transistor of the invention under the off state conditions of no gate bias is illustrated by the band diagram of FIG. 4. A small field exists in the semiconductor 2. The field may be produced by either or both of two sources. If the semiconductor 2 is low conductivity p material, the source is acceptors. If the semiconductor 2 is semi-insulating, the source is carrier traps. Since the gate 1 is constructed to be more heavily doped than the channel 2 as shown in FIGS. 3 and 4, there is little band bending in the gate.

In accordance with the invention, the providing of a semiconductor gate 1 of a semiconductor material 1 with a staggered bandgap with respect to the bandgap of the semiconductor material chosen for the channel 2 has the advantage in a field effect transistor of providing the maximum transconductance in the channel. In such structures, transconductance is as described in Equation 1.

$$g_m = C_g <v> \qquad \text{Eq. 1}$$

where $C_g$ is the gate capacitance per unit area and $<v>$ is the average velocity of the electrons in the channel.

In turn, the gate capacitance of most field effect transistors consists of the insulator capacitance $C_{ins}$ in series with the surface capacitance $C_{ss}$ of the semiconductor. This may be as expressed in Equation 2.

$$1/C_g = 1/C_{ins} + 1/C_{ss} \qquad \text{Eq. 2}$$

where $C_{ins}$ is expressed as in Equation 3.

$$C_{ins} = E_{ins}/t_{ins} \qquad \text{Eq. 3}$$

where $E_{ins}$ and $t_{ins}$ are the permittivity and thickness, respectively, of the gate insulator.

The expression of Equation 3 also applies to a Schottky barrier contact where $t_{ins}$ is the thickness of the band bending.

Under normal circumstances, the maximum transconductance obtainable with a given semiconductor would be when $t_{ins}$ was equal to zero, but this has not been achievable heretofore because of carrier interaction between the gate and the channel when the thickness of the insulator was too small.

In accordance with this invention, since there is no gate insulator or Schottky barrier, then the structure of this invention provides maximum transconductance because effectively it provides a structure in which $t_{ins}$ is equal to zero.

BEST MODE FOR CARRYING OUT THE INVENTION

The preferred embodiment of the invention referring to FIGS. 2 and 3 would be one in which the channel semiconductor material 2 would be undoped or lightly doped p conductivity type InP and the gate semiconductor 1 would be heavily doped p type of the order of $10^{19}$ or more atoms/cc of AlInAs. The forward bias $V_G$ would be of the order of 0.3 volts between gate 1 and channel semiconductor.

What has been described is a field effect transistor principle providing better transconductance and drive capability by having a highly doped gate of opposite conductivity type of the channel, having the energy band of the semiconductor of the gate staggered with respect to that of the semiconductor of the channel so as to provide a barrier to both electrons and holes with respect to the interface.

Having thus described my invention, what I claim as new and desire to secure by Letters Patent is:

1. A field effect transistor comprising in combination
a first semiconductor material member
having source and drain regions separated by a channel region,
a second semiconductor material gate member of higher conductivity than said first semiconductor material positioned contiguous with and forming a heterojunction with said channel region,
the valence band edge of said second semiconductor material gate member and the conduction band edge of said first semiconductor material being disposed opposite the forbidden gaps of said first semiconductor material member and said second semiconductor material gate member, respectively.

2. The transistor of claim 1 wherein said gate semiconductor member is heavily doped.

3. The transistor of claim 2 wherein said gate semiconductor member is p++ conductivity type.

4. The transistor of claim 2 wherein said first semiconductor member is lightly doped p conductivity type InP and said second semiconductor gate member is heavily doped p conductivity type AlInAs.

5. The transistor of claim 2 wherein said first semiconductor member is undoped InP and said second semiconductor gate member is heavily doped p conductivity type AlInAs.

* * * * *